United States Patent [19]

Kuhlman et al.

[11] 4,412,255
[45] Oct. 25, 1983

[54] TRANSPARENT ELECTROMAGNETIC SHIELD AND METHOD OF MANUFACTURING

[75] Inventors: Bruce E. Kuhlman; Marc A. Kamerling, both of Santa Rosa, Calif.

[73] Assignee: Optical Coating Laboratory, Inc., Santa Rosa, Calif.

[21] Appl. No.: 237,367

[22] Filed: Feb. 23, 1981

[51] Int. Cl.³ .............................................. H04N 5/65
[52] U.S. Cl. .................................. 358/245; 358/252; 174/35 MS
[58] Field of Search ............. 358/245, 255, 252, 253; 174/35 MS; 219/10.55 D

[56] References Cited

U.S. PATENT DOCUMENTS

| | | | |
|---|---|---|---|
| 2,943,964 | 7/1960 | Goldemberg | 358/252 |
| 4,231,068 | 10/1980 | Hunt | 358/252 |
| 4,246,613 | 1/1982 | Choder et al. | 358/245 |

Primary Examiner—Robert L. Griffin
Assistant Examiner—Edward L. Coles

Attorney, Agent, or Firm—Flehr, Hohbach, Test, Albritton & Herbert

[57] ABSTRACT

A transparent electromagnetic shield adapted for use on an information display device in electronic equipment. First and second transparent substrates each having major front and back surfaces are adapted to be mated together with a front surface of one substrate facing a back surface of the other. A conductive wire screen is interposed between the first and second substrates in physical contact with one of the mating front and back surfaces thereof and a single layer of polymer laminating material is interposed between the screen and the other of the mating surfaces. The layer of polymer laminating material fills the apertures in the screen and contacts portions of both mating surfaces to bond the screen and the two substrates together. An embodiment in which the wire screen is provided in contact with a conductive transparent optical coating on one of the mating surfaces of the substrates is also disclosed. A conductive metal tape is wrapped around the edge of the substrate in contact with the wire screen to serve as a bus bar contact to the screen, enabling use of a screen the same size as the substrate.

15 Claims, 6 Drawing Figures

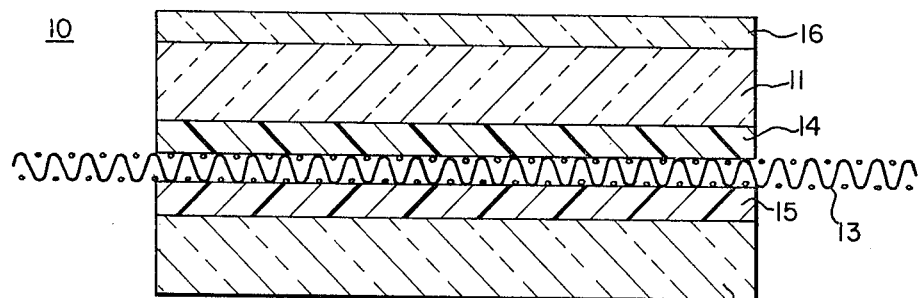
FIG.—1 (PRIOR ART)
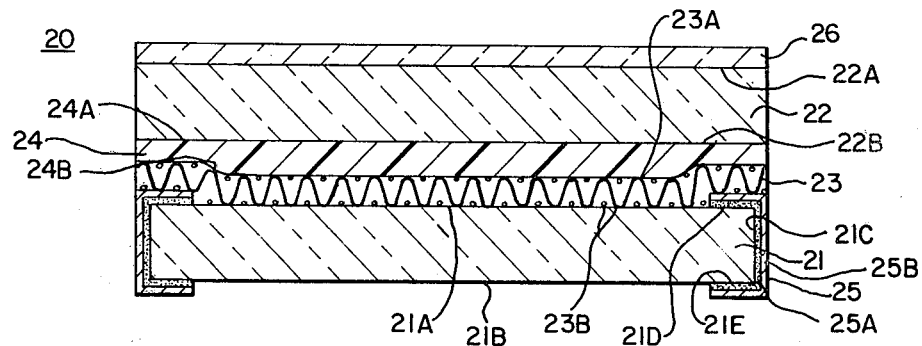
FIG.—2
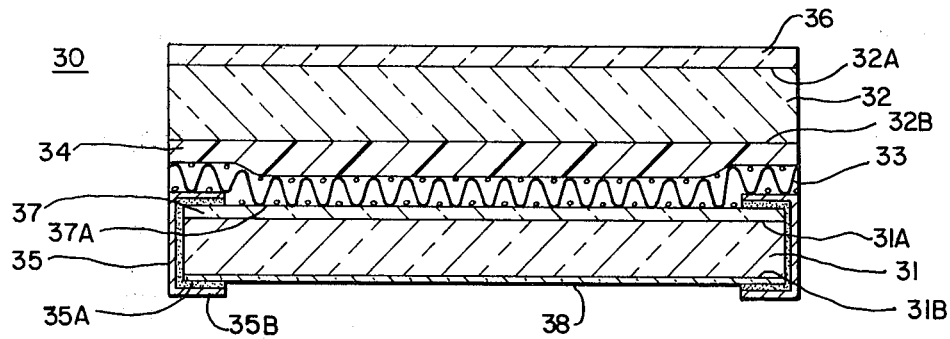
FIG.—4

TRANSPARENT ELECTROMAGNETIC SHIELD AND METHOD OF MANUFACTURING

This invention relates generally to electromagnetic shields and, more specifically, to transparent electromagnetic shields and methods of manufacturing such shields for use on an information display device in electronic equipment.

Electronic computer terminals and other electronic instrumentation that are utilized to process classified government information are required to be shielded against emanation of electromagnetic radiation. This is required so that the equipment does not transmit a level of electromagnetic radiation into the air which can be detected and decoded by highly sensitive detectors. Generally the shielding of most portions of electronic equipment is readily achieved utilizing a continuous layer of conventional electromagnetic shielding material surrounding the equipment. However, some types of electronic equipment require the utilization of a display device such as the display CRT on a computer terminal or on radar equipment. Since the purpose of the display device is to permit visualization of information, the opaque radiation shielding around the equipment containing the display device must have a window formed in it through which the displayed information may be viewed.

The normal face panel of a CRT display device simply comprises a transparent substrate with a phosphor layer and an aluminum layer formed on the inner surface thereof for responding to an incident electron beam by emitting light energy. The ordinary CRT face panel does not provide effective shielding against emanations of electromagnetic signal radiation generated within the electronic equipment. As a result, for such display devices as are utilized in displaying classified government information or battlefield information on electronic equipment, transparent electromagnetic shield panels are required to be placed in front of the CRT display panel in order to suppress the electromagnetic radiation of information signals from the interior of the electronic equipment through the CRT face panel.

To provide the shielding effectiveness needed for such transparent electromagnetic shields, a conventional approach is to utilize a conductive wire screen laminated between two transparent substrates with the wire screen extending beyond the edge surfaces of the substrates in order to permit termination of the screen together with the shielding enclosure surrounding the display device to complete the electromagnetic shielding around the electronic equipment.

FIG. 1 illustrates the structure of a conventional prior art electromagnetic shielding panel. This prior art panel 10 consists essentially of a pair of glass substrates 11 and 12 and a conductive wire screen 13. The two transparent glass substrates 11 and 12 are laminated to the wire screen 13 utilizing two sheets of polyvinyl butyral 14 and 15 to bond each side of the wire screen 13 to the glass substrates 11 and 12. The shielding effectiveness of this conventional prior art panel is very good provided the wire screen 13 is effectively terminated together with the other shielding surrounding the equipment. To enable termination of the wire screen in this prior art assembly, a substantial area of the wire screen is left protruding around all sides of the laminated substrates.

Good electrical contact may be made to these protruding portions of the conductive screen by clamping the protruding screen portions in a frame with screws. Another approach that has been taken to terminating the protruding portions of the wire screen is by wrapping the protruding portions around the back surface of the back glass panel and cementing it to a bus bar pattern formed on the peripheral portions of this back surface. Good electrical contact can then be made to the screen and to the bus bar utilizing a clamping frame arrangement on the peripheral portions of the laminated shield assembly. Because the protruding wire screen portions are so fragile, it is relatively easy to produce tears or holes in this protruding wire screen so the handling of the shield arrangement both during the manufacturing process and during the process of mounting it in an appropriate frame is a very delicate process. Should a tear or hole develop in the protruding wire screen portions, it may render the complete shielding panel defective. Moreover, if a hole develops in the protruding wire screen as it is being mounted into a frame, it has been discovered that instead of providing effective shielding for the electromagnetic radiation, the protruding wire screen actually acts like an antenna.

It is a principal object of this invention to provide a transparent electromagnetic shield of improved construction.

It is a further object of this invention to provide an improved method of manufacturing a transparent electromagnetic shield.

It is a further object of this invention to provide an improved arrangement for terminating a conductive wire screen element in a transparent electromagnetic shield.

It is a further object of this invention to provide a transparent electromagnetic shield having improved shielding characteristics.

It is a further object of this invention to provide a transparent electromagnetic shield having reduced manufacturing costs.

In accordance with one aspect of this invention the above-stated objects are achieved in a transparent electromagnetic shield adapted for use on an information display device in the electronic equipment which includes first and second transparent substrates each having major front and back surfaces with a front surface of one substrate adapted to be mated together with a back surface of the other. A conductive wire screen is interposed between the first and second substrates in physical contact with one of the mating front and back surfaces thereof. A single layer of polymer laminating material is interposed between the screen and the other of the mating surfaces to bond the screen thereto. The layer of polymer laminating material fills the apertures in the screen and contacts portions of the substrate surface in contact with said screen to bond the screen to that surface and to bond the first and second substrates together.

In a preferred embodiment the substrate having the conductive wire screen in contact therewith has an electrical bus bar arrangement formed on the edge surface thereof and on narrow peripheral regions of the front and back surfaces thereof. The wire screen is formed to a geometric configuration substantially identical to the geometric configuration of the surface of the substrate so that an edge portion of the wire screen is in physical contact with the portion of the bus bar arrangement on the mating surface. In this fashion the bus bar arrangement provides for good electrical contact to and termination of the conductive wire screen without extending the portions of the screen outside the surfaces of the substrate. The bus bar arrangement may comprise a layer of thin tape having an electrically conductive top surface portion and an adhesive bottom surface portion wrapped around the edge surface and narrow peripheral regions of the front and back surfaces of the substrate. This electrically conductive tape may, for example, comprise either a copper, silver, or aluminum coated tape.

In one embodiment of a transparent electromagnetic shield in accordance with this invention the substrate surface which is in contact with the conductive wire screen has formed thereon an optical coating comprising a layer of material having high transparency and substantial electrical conductivity. This optical coating may, for example, comprise a thin layer of indium-tin oxide.

In accordance with another aspect of this invention, the above-stated objects are achieved in a method for forming a transparent electromagnetic shield for use on an information display device in electronic equipment which begins with the step of disposing a conductive wire screen across and in contact with one major surface of a first transparent substrate. The method continues with the step of disposing over the conductive wire screen a sheet of polymer laminating material, followed by the step of disposing over the sheet of polymer laminating material a second transparent substrate having a major surface adapted to mate with the major surface of the first substrate. Thereafter, pressure and heat are applied to the assemblage of the first and second substrate, the screen and the sheet of laminating material to bond the assemblage together, the conductive wire screen remaining in contact with the surface of the first transparent substrate.

The method of this invention preferably includes an additional step performed prior to disposing the wire screen across the surface of the first transparent substrate which involve forming an electrically conductive bus bar arrangement on the edge surface and on narrow peripheral regions of the front and back surfaces of the first substrate. Prior to disposing the conductive wire screen across the surface of the first transparent substrate, it is cut to match substantially the configuration of said surface so that when it is disposed onto said surface a peripheral edge portion is in contact with the electrical bus bar arrangement formed thereon. The step of forming the bus bar arrangement may simply comprise the step of wrapping around the edge of the first transparent substrate a layer of thin tape having an electrically conductive top surface portion and an adhesive bottom surface portion in contact with corresponding surface portions of the substrate.

In one embodiment of the method of this invention, prior to the step of disposing the conductive wire screen across the major surface of the first transparent substrate an optical coating is formed on that surface with the optical coating comprising a layer of material having high transparency and a substantial electrical conductivity.

A transparent electromagnetic shield structure and method of this invention provides a number of important improvements over the structure and method of the prior art. First of all, the production cost of the transparent electromagnetic shield apparatus of this invention is reduced by avoiding the expense of utilizing two layers of polymer laminating material to bond the two substrates and the wire screen together. The discovery that a single layer of polymer laminating material is sufficient to bond the two substrates and the conductive wire screen together with the screen remaining in physical contact with the surface of the substrate to which it is mated, enables termination of the conductive wire screen utilizing a wraparound bus bar arrangement on the front, edge and back surface portions of the substrate. This totally eliminates the need for extending edge portions of the conductive wire screen outside the edges of the substrates in order to terminate that element. This results in a much more durable and reliable wire screen termination and also produces a substantial manufacturing cost savings in terms of the amount of wire mesh utilized. Not only is the wire screen element terminated with greater durability and reliability, but the termination structure makes it much simpler to mount the electromagnetic shield in a frame and make reliable contact to the bus bar arrangement with the frame.

An additional advantage of this invention is that it enables the utilization of a conductive transparent optical coating on the surface of one of the substrates which is in physical contact with the conductive wire screen. The termination arrangement for the conductive wire screen together with the conductive wire screen itself provides termination of the electrically conductive optical coating. The combination of the transparent conductive optical coating and the wire screen provides enhanced electromagnetic shielding effectiveness for the overall assembly.

Other objects, features, and advantages of this invention will be apparent from a consideration of the following detailed description thereof in conjunction with the accompanying drawings.

FIG. 1 is a cross sectional view through a transparent electromagnetic shield in accordance with the prior art structure and method.

FIG. 2 is a cross sectional view through a transparent electromagnetic shield having a structure in accordance with this invention and being manufactured in accordance with the method of this invention.

FIG. 4 is a cross sectional view through an alternative embodiment of a transparent electromagnetic shield in accordance with this invention. an embodiment of a transparent electromagnetic shield as illustrated in FIG. 2.

Figure 3:
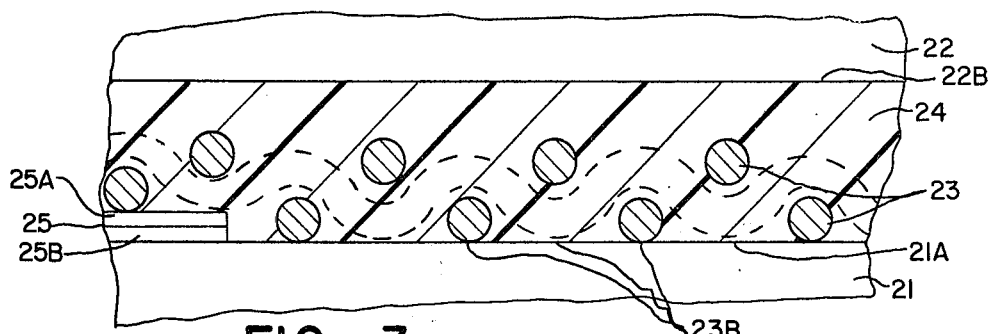
FIG. 3 is an enlarged partial cross section showing a portion of the structure of a transparent electromagnetic shield in accordance with this invention.

FIG. 1 of the drawings has been described above in connection with the prior art background of this invention and need not be discussed further here. FIG. 2 illustrates one embodiment of a transparent electromagnetic shield in accordance with the concepts of this invention. The improved shield of this invention includes a first transparent substrate 21, a second transparent substrate 22, a conductive wire screen 23, a single layer of polymer laminating material 24, and a wraparound bus bar arrangement 25. FIG. 2 illustrates the assemblage of these components prior to placing the assemblage through the final laminating process.

As shown in FIG. 2, transparent substrate 21 has the wraparound bus bar arrangement 25 formed on edge surface 21C and edge portions 21D and 21E of the top surface 21A and bottom surface 21B, respectively, of substrate 21. Preferably, wraparound bus bar arrangement 25 is formed around the entire periphery of substrate 21. It is particularly preferable that the bus bar arrangement 25 be continuous around the peripheral edge portions 21D of the top surface 21A of substrate 21 in order to make contact with the conductive wire screen 23 continuously around the edge portions thereof. It is unnecessary that the portions of bus bar arrangement 25 formed on the edge surface 21C of substrate 21 be continuous or that the portion wrapped around the peripheral portion 21E of the surface 21B of substrate 21 be continuous but it is generally preferable that the wraparound bus bar arrangement 25 be continuous about the complete periphery of substrate 21. In this manner the electrical contact termination of the conductive wire screen 23 is most completely assured.

After the wraparound bus bar arrangement 25 has been formed on substrate 21, conductive wire screen 23 is disposed across the substrate 21. The surface portions 23B of conductive wire screen 23 are directly in contact with the surface 21A of substrate 21. As shown in FIG. 2, the configuration of conductive wire screen 23 substantially matches the configuration of substrate 21 so that no portions of conductive wire screen 23 extend outside the edge boundaries of substrate 21. In FIG. 2 the edges of conductive wire screen 23 are shown extending to the edge boundary of the wraparound bus bar arrangement 25, but it should be understood that the edges of conductive wire screen 23 could be inset from the edge boundary of the wraparound bus bar arrangement 25 so long as a substantial overlap of the edge portions of conductive wire screen 23 and the portion of the bus bar arrangement 25 formed on the peripheral portions 21D of substrate 21 is provided. In other words, it is important that good electrical contact is made between a substantial area of the bottom surface 23B of the conductive wire screen 23 and the wraparound bus bar arrangement 25 in order that the bus bar arrangement 25 will electrically terminate conductive wire screen 23 in an effective manner.

A single sheet of polymer laminating material 24 is disposed over the conductive wire screen 23. The bottom surface 24B of laminating sheet 24 is in contact with the top surface portions 23A of conductive wire screen 23. This shows the layup arrangement of the laminating sheet 24 with respect to the conductive wire screen 23 before the laminating process is performed thereon. A second transparent substrate 22 is placed over the laminating sheet 24 with its surface 22B in contact with the surface 24A of laminating sheet 24. The external surface 22A of transparent substrate 22 preferably has an optical coating 26 formed thereon which has the properties of an antireflection layer. This antireflection coating 26 is formed on the transparent substrate 22 in any conventional manner prior to placing substrate 22 in the assemblage shown in FIG. 2.

FIG. 3 depicts in enlarged section view the structure of the two transparent substrates 21 and 22, the conductive wire screen 23, and the layer 24 of polymeric laminating material after the assemblage depicted in FIG. 2 has been subjected to a standard laminating process. This typical laminating process involves placement of the assemblage of elements depicted in FIG. 2 on a conveyor which carries the assemblage through two sequential ovens and two stages of nip rollers. The two ovens are utilized to presoften the polymeric laminating material 24 to provide some initial adherence between the structural elements while they are being processed. The nip rollers apply pressure between the two substrates 21 and 22 to squeeze the air out from between the various elements in the assemblage of FIG. 2. Removal of this air is necessary in order to avoid the creation of an air bubble in the final laminating process which would produce a resultant visual defect in the finished transparent electromagnetic shield. After the assemblage shown in FIG. 2 has passed through the two ovens and the two sets of nip rollers, it enters into an autoclave operating at an internal temperature of about 250 to 270 degrees Fahrenheit and a pressure of around 150 psi.

In the autoclave the thermoplastic laminating material 24 softens to the point that it flows between the strands in the conductive wire screen 23 and contacts the surface 21A of substrate 21 as depicted in FIG. 3. Because of the pressure applied to the assembly, the surface portions 23B of the conductive wire screen 23 remain in intimate contact with the surface 21A of substrate 21. Even more importantly the surface portions 23B remain in intimate contact with the wraparound bus bar arrangement 25 on the peripheral portion 21D of surface 21A of substrate 21. Thus good electrical contact is made between the conductive wire screen 23 and the wraparound bus bar arrangement 25.

For most embodiments the transparent substrates 21 and 22 may comprise pieces of glass having a refractive index of 1.52. The thickness of the glass is not critical and may be tailored to the particular application for the shield. In addition to utilizing glass for the substrates 21 and 22 various types of transparent polymeric materials such as the polycarbonates and the acrylics may also be utilized. Some types of polymeric materials may require a surface treatment to provide good adherence to the polymeric laminating material 24. The antireflection coating 26 formed on the front surface 22A of substrate 22 may consist simply of a quarterwave layer of a transparent dielectric material such as magnesium fluoride or it may consist of a multilayer optical coating having antireflection properties such as the one disclosed in Thelen U.S. Pat. No. 3,185,020 or the antireflection coating disclosed in Apfel et al. U.S. Pat. No. 3,761,160. Conventional methods may be utilized for forming the antireflection coating 26 and need not be set forth in detail here.

The wraparound bus bar arrangement 25 depicted in FIG. 2 is an electrically conductive tape having an adhesive layer 25A in contact with the edge and peripheral top surface portions of substrate 21 and an electrically conductive layer 25B which is in contact with the peripheral portions of surface 23B of conductive wire screen 23. Using the conductive tape as the wraparound bus bar arrangement, the formation of the wraparound bus bar arrangement may be simply accomplished by wrapping lengths of the tape equal to the lengths of the sides of the substrate 21 around the edge surface portions of the substrate on all four sides. It is unnecessary that all four segments of the conductive tape be in electrical contact with each other since the shield 20 will typically be mounted in a frame which makes electrical contact with the back surface portion of the wraparound bus bar arrangement 25 at substantially continuous portions of that section of the bus bar arrangement. Various types of conductive electrical tapes may be utilized. For example, aluminum, silver, and copper tapes have been successfully utilized in forming the bus bar arrangement 25 on various shielding panel assemblies. These types of conductive tapes are commercially available and the following table gives the manufacturer's part number and conductivity specification for the aluminum, copper, and silver tapes which have been successfully utilized:

| Name of Manufacturer | Part No. | Tape Conductivity |
| --- | --- | --- |
| 3 M | #118 (Copper) | $1.7 \times 10^{-6}$ ohm-cm |
| 3 M | #11702ECA8305 (Alum) | $2.6 \times 10^{-6}$ ohm-cm |
| 3 M | #425 (Alum) | $2.6 \times 10^{-6}$ ohm-cm |
| Emmerson-Cuming | Ecobond | $6 \times 10^{-4}$ ohm-cm |

Various approaches may be taken to providing the wraparound bus bar arrangement 25. For example, a silver epoxy manufactured by Acme and having an electrical conductivity of $5 \times 10^{-4}$ ohms-cm may be formed on the peripheral and edge surface portions of substrate 21 to provide a wraparound bus bar arrangement. Any other type of conductive frit or other conductive material which has a high electrical conductivity, and good adhesion to the surface of substrate 21 can also be utilized provided it can be applied in sufficiently thin layers so that the substrates 21 and 22 will not be subjected to unwarranted bending stresses during the laminating process. Excess bending stresses could cause one or both of the substrates 21 and 22 to crack if the substrates are glass. The thickness of the wraparound bus bar arrangement 25 is not as critical if the substrates 21 and 22 are a polymeric plastic material which is relatively flexible.

Conductive wire screen 23 is may comprise a stainless screen which is plated with a layer of silver to increase its conductivity. Conventionally the conductive wire screen is constucted with a mesh of about one hundred wires per inch with each wire being 0.001 inch in diameter before plating with silver. The silver plating on the screen may be formed to a thickness of about 0.0004 inches. After the screen is plated with silver, the silver layer is typically converted to a silver sulfide to give the screen a less reflective, black or charcoal grey visual appearance without affecting the electrical conductivity thereof. The above described structure of the conductive wire screen 23 is only one example of a conductive wire screen structure which may be utilized. The mesh of the screen may vary between about thirty wires per inch to one hundred twenty wires per inch. Generally, the higher the mesh number the greater the shielding effectiveness of the conductive wire screen but the lower the transmittance of visible light through the screen. The material of the conductive wire screen is not critical and, in addition to the stainless steel screen material described above, other highly conductive wire materials such as tungsten, molybdenum, nickel and copper, could also be utilized.

The polymeric laminating sheet 24 is preferably a sheet of poly-vinyl-butyral (PVB). In addition, other thermoplastic laminating materials such as cellulose-acetate-butyral could be utilized. PVB is preferred for use with glass substrates because its index of refraction is very close to that of glass (about 1.48-1.50) and thus avoids the creation of multiple internal reflecting surfaces within the shield assembly. The PVB material is also preferred because it is easy to use and easy to control during the laminating process to provide a good bond between the various components of the assembly.

FIG. 4 illustrates an alternative embodiment of a transparent electromagnetic shield incorporating the concepts of this invention. The shield 30 of this embodiment is essentially the same as that depicted in FIG. 2 with the exception that a layer 37 of transparent conductive material has been formed on surface 31A of substrate 31 prior to assembling substrate 31 together with the conductive wire screen 33, the polymeric laminating material 34, and the second substrate 32. In addition, a second antireflection coating 38 is shown formed on surface 31B of substrate 31. This second antireflection coating may also be provided in the embodiment shown in FIG. 2. The use of antireflection coatings on only the front surface or antireflection coatings on both surfaces of the shield depends on the environment in which the shield is utilized and is typically one of the parameters specified by the original equipment manufacturer purchasing the shield assembly. The transparent antireflection coatings 38 and 36 may have the same structure as the antireflection coating 26 shown in FIG. 2 and described above.

The layer 37 of transparent electrically conductive material may consist of, for example, a thin layer of indium-tin oxide deposited onto surface 31A of substrate 31. The method and apparatus utilized for forming an indium-tin oxide layer may, for example, be that disclosed in a copending and commonly assigned Gurev patent application entitled "Method and Apparatus for Forming Thin Film Oxide Layers Using Reactive Evaporation Techniques", Ser. No. 194689, filed Oct. 6, 1980. Other techniques for forming an indium-tin oxide coating such as sputtering or chemical vapor deposition may also be employed. It is preferable to utilize an indium-tin oxide coating having a fairly high conductivity, such as for example, a sheet resistivity in the range of about two to one hundred ohms per square. Preferably, the transmission of the coating will be at least fifty percent and preferably higher. In addition to utilizing thin films of indium-tin oxide other types of conductive transparent films such as thin films of gold, silver, aluminum, or copper could also be utilized. However, these latter materials are not preferred because thin films of these materials deposited with sufficient thickness to have a high conductivity will also have a visible light transmission value which is in the range of 1-50 percent. Such metal films also have relatively high reflectance which is undesirable in this type of shield.

Generally, the provision of transparent conductive coating 37 on the surface 31A of substrate 31 will improve the shielding effectiveness of the transparent electromagnetic shield assembly 30 over that of the shield assembly 20 depicted in FIG. 2. In general, however, the shield assembly 30 in FIG. 4 will have a lower overall optical transmission than that of the shield assembly 20 of FIG. 2.

Figure 5:
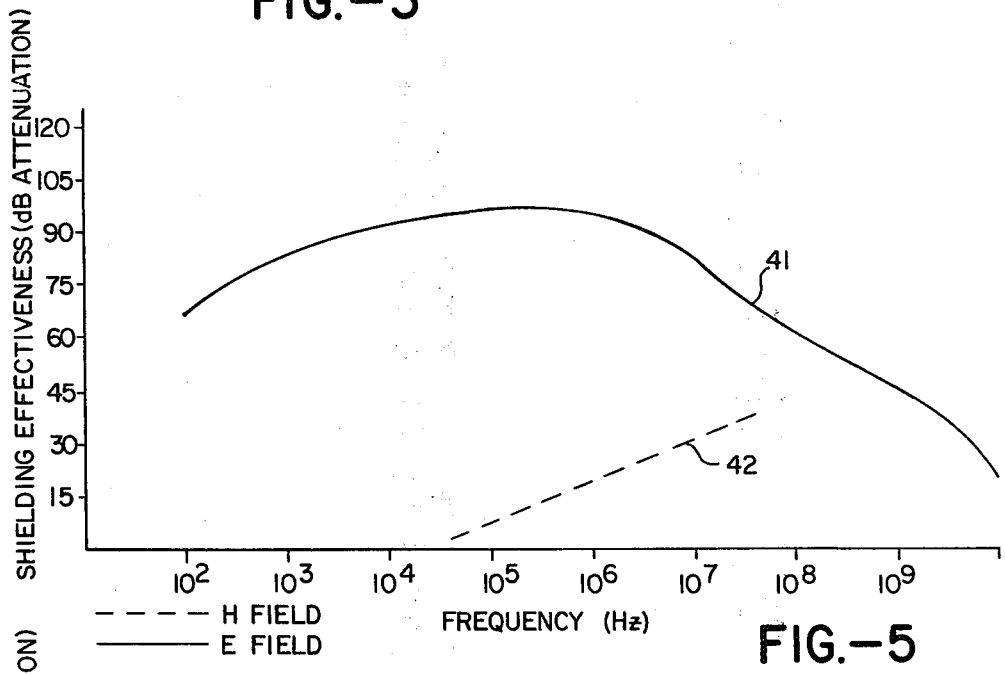

FIG. 5 depicts the shielding effectiveness of a transparent electromagnetic shield constructed in accordance with the arrangement shown in FIG. 2. Curve 41 represents the E field shielding effectiveness and the dashed curve 42 represents the H field shielding effectiveness. The particular shield assembly for which the data reflected in the graphs of FIG. 5 was taken consisted of a pair of glass substrates laminated together with a single sheet of PVB material having an original thickness of 15 mils utilizing a conductive wire screen consisting of stainless steel wires having a mesh of one hundred wires per inch, each wire being 0.001 inch diameter and being plated with a silver layer of 0.0004 inch thickness. The wraparound bus bar arrangement 25B was formed utilizing a copper coated tape. In addition to having sufficient shielding effectiveness, transparent electromagnetic shields fashioned in accordance with the structure depicted in FIG. 2 have also successfully passed reliability testing in accordance with Mil. Standard 810B cyclic humidity. These tests have adequately demonstrated that sufficient bonding of the overall components of the assemblage depicted in FIG. 2 is achieved using a single layer of PVB laminating material.

Figure 6:
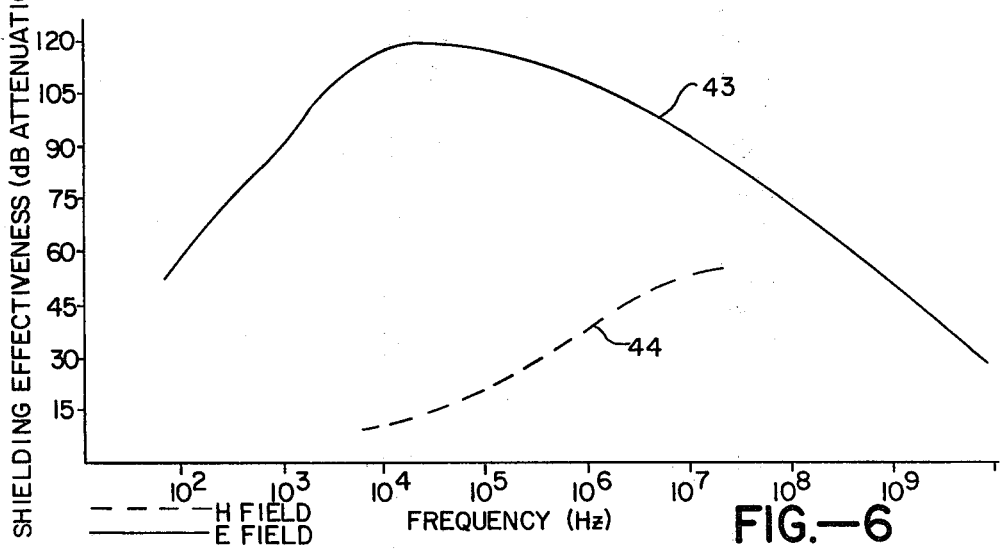
FIG. 6 is a graph of the shielding effectiveness of an alternative embodiment of a transparent electromagnetic shield as illustrated in FIG. 4.

FIG. 6 depicts the shielding effectiveness of a transparent electromagnetic shield assembly having the structure depicted in FIG. 4. The shield assembly for which the data shown in FIG. 6 was taken utilized the same overall components as the shield associated with the data depicted in FIG. 5, except that the shield assembly associated with the data in FIG. 6 utilized a thin transparent layer of indium-tin oxide having a sheet resistivity of about 50 ohms per square. Comparing the curve 43 for the E field shielding effectiveness in FIG. 6 to the curve 41 for the E field shielding effectiveness in FIG. 5, it will be seen that the shielding effectiveness is about an order of magnitude greater for the FIG. 4 shield embodiment associated with the data in FIG. 6 over the FIG. 2 embodiment associated with the data in FIG. 5. This additional shielding effectiveness may become important if the technology for intercepting electromagnetic radiations emanating from display devices improves in sensitivity requiring an attendant improvement in the effectiveness of the transparent electromagnetic shield utilized on display devices in the electronic equipment processing and displaying classified government information.

It will be readily appreciated that the transparent electromagnetic shield structure depicted in the FIG. 2 and FIG. 4 embodiments greatly facilitates the incorporation of the shield assembly into a clamping frame which makes contact with the wraparound bus bar arrangement 25 or 35 as part of the frame structure for mounting the shield assembly in front of a CRT face panel on a display device. Typically a clamping-type frame arrangement will be utilized with an external flange on the clamping arrangement secured to the bezel surrounding the CRT face panel. The clamping frame itself can be utilized to make good electrical contact to the bus bar arrangements 25 or 35 and electrical contact to the other shielding elements on the display device may be made either through the frame assembly or by separate conductive bus bar arrangements connected between the frame assembly and other elements of the shielding around the display device. Numerous alternative approaches to mounting the shield assembly of this invention in front of the CRT face panel or other display panel may be utilized by those skilled in the art. The particular method and approach utilized does not form a part of this invention. However, it will be readily appreciated that the wraparound bus bar arrangement of this invention is highly advantageous in comparison to the termination arrangements which must be utilized in conjunction with the prior art structure depicted in FIG. 1. Termination of the structure shown in FIG. 1 requires not only a mounting of the shield 10 in a frame for, in turn, mounting the shield and frame arrangement in front of the display panel but also requires a separate connection of some sort to the fragile conductive wire screen portions extending outside the boundaries of the front and back substrates 11 and 12. Good electrical contact must be made to these extensions of the conductive wire screen either continuously around the peripheral portions thereof or at regular intervals along the peripheral portions thereof. If contact is made by way of forming holes through the conductive wire screen, rips and tears can easily develop in the screen as it is being assembled and these rips and tears may render the overall assembly defective.

In addition to the convenience of mounting a shield having the structure of this invention, important manufacturing cost reductions are also achieved utilizing the concepts of this invention. Savings in both labor and material costs are provided by eliminating the requirement of the second sheet of PVB laminating material and by reducing the size of the conductive wire screen which must be utilized in the overall assembly. The overall panel assemblies depicted in FIGS. 2 and 4 are much easier to lay up than that of the prior art depicted in FIG. 1. The assembly of the shield arrangements depicted in FIGS. 2 and 4 is much less critical than that of the prior art unit depicted in FIG. 1 and fewer overall assembly rejects will be produced. Furthermore, when greater shielding effectiveness is required, the structural arrangement of the wraparound bus bar 35 and the single laminating layer 34 enables good electrical contact to be made via the bus bar arrangement with both the conductive wire screen 33 and the transparent conductive coating 37 through the conductive wire screen 33. This eliminates any need for a separate terminating arrangement which would otherwise have to be provided for use of a transparent conductive coating if provided in the prior art structure shown in FIG. 1.

While the apparatus and method of this invention have been disclosed above in conjunction with various alternative embodiments, it should be understood that numerous additional embodiments and numerous changes in the disclosed embodiments could be made by those skilled in the art without departing from the scope of this invention as claimed in the following claims.

What is claimed is:

1. A transparent electromagnetic shield adapted for use on an information display device in electronic equipment comprising first and second transparent substrates each having major front and back surfaces with a front surface of one substrate adapted to be mated together with a back surface of the other, a conductive wire screen interposed between said first and second substrates in physical contact with one of said mating front and back surfaces thereof, and a single layer of polymer laminating material interposed between said screen and the other of said mating surfaces to bond said screen thereto, said layer of polymer laminating material filling the apertures in said screen and contacting portions of said one mating surface to bond said screen thereto and to bond said first and second substrates together.

2. Apparatus as claimed in claim 1, wherein said one substrate surface in intimate physical contact with said wire screen has formed thereon an optical coating comprising a layer of material having high transparency and being substantially electrically conductive.

3. Apparatus as claimed in claim 2, wherein said optical coating comprises a thin layer of indium-tin oxide.

4. Apparatus as claimed in claim 1, wherein said substrate having said screen in contact therewith has formed on the edge surface thereof and on narrow peripheral regions of said front and back surfaces thereof an electrically conductive bus bar arrangement, said wire mesh screen being formed to a geometric configuration substantially identical to the geometric configuration of said mating surfaces, and an edge portion of said wire screen being in physical contact with portions of said bus bar arrangement on said one surface.

5. Apparatus as claimed in claim 4, wherein said bus bar arrangement comprises a layer of thin tape having an electrically conductive top surface portion and having an adhesive bottom surface portion wrapped around said edge surface and narrow peripheral regions of said front and back surfaces.

6. Apparatus as claimed in claim 5, wherein said electrically conductive tape is an aluminum or copper coated tape.

7. Apparatus as claimed in claim 2, wherein said substrate having said screen in contact therewith has formed on the edge surface thereof and on narrow peripheral regions of said front and back surfaces thereof an electrically conductive bus bar arrangement, said wire screen is formed to a geometric configuration substantially identical to the geometric configuration of said mating surface, and an edge portion of said screen is in physical contact with portions of said bus bar arrangement on said one surface, said bus bar arrangement thereby being adapted to make electrical contact to said wire mesh screen and to said optical coating in contact with said screen.

8. Apparatus as claimed in claim 7, wherein said bus bar arrangement comprises a layer of thin tape having an electrically conductive top surface portion and having an adhesive bottom surface portion wrapped around said edge surface and narrow peripheral regions of said front and back surfaces.

9. Apparatus as claimed in claim 8, wherein said electrically conductive tape is an aluminum or copper coated tape.

10. In a method for forming a transparent electromagnetic shield for use on an information display device in electronic equipment, the steps of:
    disposing a conductive wire screen across and in contact with one major surface of a first transparent substrate;
    disposing over said conductive wire screen a sheet of polymer laminating material;
    disposing over said sheet of polymer laminating material a second transparent substrate having a major surface adapted to mate with said major surface of said first substrate; and
    applying pressure and heat to the assemblage of said first and second substrate, said screen and said sheet of laminating material to bond said assemblage together.

11. The method of claim 10, wherein prior to the step of disposing said conductive wire screen across said one major surface of said first transparent substrate, there is performed the initial step of forming an optical coating on said one major surface comprising a layer of material having high transparency and being substantially electrically conductive.

12. The method of claim 10, wherein prior to the step of disposing said conductive wire screen across said surface of said first transparent substrate is performed the step of forming on the edge surface of said first substrate and on narrow peripheral regions of front and back surfaces thereof an electrically conductive bus bar arrangement, said conductive wire screen is cut to match the configuration of said one major surface of said first transparent substrate, and said conductive wire screen is disposed in contact with said one major surface and a portion of said bus bar arrangement thereon.

13. The method of claim 12, wherein the step of forming said bus bar arrangement comprises the step of wrapping around the edge of said first transparent substrate a layer of thin tape having an electrically conductive top surface portion and an adhesive bottom surface portion in contact with said surface portions of said substrate.

14. The method of claim 10, wherein prior to the step of disposing said conductive wire screen across said major surface of said first transparent substrate, there is performed the steps of forming on said one major surface an optical coating comprising a layer of material having high transparency and substantial electrical conductivity; and
    forming an electrically conductive bus bar arrangement on the edge surface and narrow peripheral regions of said front and back surfaces of said first transparent substrate.

15. The method of claim 14, wherein said step of forming said bus bar arrangement comprises the step of wrapping around said surface portions of said first substrate a layer of thin tape having an electrically conductive top surface portion and an adhesive bottom surface portion in contact with said surface portions.

* * * * *